United States Patent
Chen et al.

(10) Patent No.: US 10,197,923 B2
(45) Date of Patent: Feb. 5, 2019

(54) EXPOSURE DEVICE AND OUT-OF-FOCUS AND TILT ERROR COMPENSATION METHOD

(71) Applicant: SHANGHAI MICRO ELECTRONICS EQUIPMENT CO., LTD., Shanghai (CN)

(72) Inventors: Feibiao Chen, Shanghai (CN); Chang Zhou, Shanghai (CN); Yuefei Chen, Shanghai (CN); Qi Cheng, Shanghai (CN); Lei Diao, Shanghai (CN); Jingchao Qi, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/515,110

(22) PCT Filed: Jul. 13, 2015

(86) PCT No.: PCT/CN2015/083842
§ 371 (c)(1),
(2) Date: Mar. 28, 2017

(87) PCT Pub. No.: WO2016/045432
PCT Pub. Date: Mar. 31, 2016

(65) Prior Publication Data
US 2017/0219935 A1 Aug. 3, 2017

(30) Foreign Application Priority Data

Sep. 28, 2014 (CN) .......................... 2014 1 0508363

(51) Int. Cl.
*G03F 7/20* (2006.01)
*H01L 21/027* (2006.01)
*G03F 9/00* (2006.01)

(52) U.S. Cl.
CPC ...... *G03F 7/70641* (2013.01); *G03F 7/70275* (2013.01); *G03F 9/70* (2013.01);
(Continued)

(58) Field of Classification Search
CPC .... G03F 7/70275; G03F 7/70641; G03F 9/70; G03F 9/7003; G03F 9/7026; G03F 9/7034; G03F 9/7088
(Continued)

(56) References Cited

U.S. PATENT DOCUMENTS

| 6,455,214 B1* | 9/2002 | Wakamoto | ...... G03F 7/70358 430/22 |
|---|---|---|---|
| 2002/0075458 A1 | 6/2002 | Matsuura | |
| 2003/0190822 A1 | 10/2003 | Nakasuji | |
| 2010/0208229 A1 | 8/2010 | Shin | |

(Continued)

FOREIGN PATENT DOCUMENTS

| CN | 1459671 A | 12/2003 |
|---|---|---|
| CN | 1459671 A | 12/2003 |

(Continued)

*Primary Examiner* — Colin Kreutzer
(74) *Attorney, Agent, or Firm* — Muncy, Geissler, Olds & Lowe, P.C.

(57) ABSTRACT

In an exposure apparatus and a method for defocus and tilt error compensation, each of alignment sensors (500a, 500b, 500c, 500d, 500e, 500f) corresponds to and has the same coordinate in the first direction as a respective one of focusing sensors (600a, 600b, 600c, 600d, 600e, 600f), so that each of the alignment sensors (500a, 500b, 500c, 500d, 500e, 500f) is arranged on the same straight line as a respective one of the focusing sensors (600a, 600b, 600c, 600d, 600e, 600f). As such, alignment marks can be characterized with both focusing information and alignment information. This enables the correction of errors in the alignment information and thus achieves defocus and tilt error compensation, resulting in significant improvements in alignment accuracy and the production yield.

7 Claims, 11 Drawing Sheets

(52) U.S. Cl.
CPC .......... *G03F 9/7003* (2013.01); *G03F 9/7026* (2013.01); *G03F 9/7034* (2013.01); *G03F 9/7088* (2013.01); *H01L 21/027* (2013.01)

(58) Field of Classification Search
USPC .............. 355/55, 68; 356/399–401, 615, 624
See application file for complete search history.

(56) References Cited

U.S. PATENT DOCUMENTS

| | | | | |
|---|---|---|---|---|
| 2012/0307222 | A1* | 12/2012 | Van Zwet | G03F 7/704 355/67 |
| 2015/0260659 | A1* | 9/2015 | Chuang | H01L 27/14609 250/370.08 |

FOREIGN PATENT DOCUMENTS

| | | |
|---|---|---|
| CN | 102472987 A | 5/2012 |
| CN | 102472987 A | 5/2012 |
| CN | 102540778 A | 7/2012 |
| CN | 103777476 A | 5/2014 |
| CN | 103969961 A | 8/2014 |
| EP | 0568478 A1 | 11/1993 |
| JP | 2003-203853 A | 7/2003 |
| JP | 2004-163366 A | 6/2004 |
| JP | 2005-026614 A | 1/2005 |
| JP | 2006-195353 A | 7/2006 |
| JP | 4214849 B2 | 1/2009 |
| JP | 4214849 B2 | 1/2009 |
| JP | 2010-217389 A | 9/2010 |
| JP | 2010-266689 A | 11/2010 |
| JP | 2011-059489 A | 3/2011 |
| JP | 4760019 B2 | 8/2011 |
| JP | 4760019 B2 | 8/2011 |
| JP | 2011-238788 A | 11/2011 |
| JP | 2012-242811 A | 12/2012 |
| WO | WO2008/065977 A1 | 6/2008 |
| WO | WO 2008065977 A1 | 6/2008 |

* cited by examiner

EXPOSURE DEVICE AND OUT-OF-FOCUS AND TILT ERROR COMPENSATION METHOD

TECHNICAL FIELD

The present invention relates to the field of semiconductor manufacturing technology and, in particular, to an exposure apparatus and a method for defocus and tilt error compensation.

BACKGROUND

With the size and resolution of LCD displays continuously increasing, projection photolithography tools, one of the most essential processing equipment in the field of LCD displays, are faced with a number of technical challenges. Nowadays, in order to meet the demand for larger-sized LCD displays with higher resolutions, most photolithography tools of the latest generations employ either of the following two approaches to obtain a high exposure yield of large-sized glass substrates: 1) use of a single large-sized projection objective lens, adopted for example by the Japanese company Canon Inc. as a solution for latest-generation exposure photolithography; and 2) use of a combination of multiple objective lenses, adopted for example by the Japanese company Nikon Corporation and details of which can be seen with reference to the patent document CN1459671A entitled "Exposure Method, Exposure Apparatus and Device Fabrication Method".

With reference to a schematic illustration of an exposure apparatus according to CN1459671A, the exposure apparatus comprises, disposed sequentially in a vertical direction, an illumination optical system IL, a mask stage MST, a projection optical system PL and a photosensitive substrate P. The mask stage MST is configured to carry a mask M. During operation of the exposure apparatus, the mask M and the photosensitive substrate P move in synchronization relative to the projection optical system PL along the X axis, such that an area of the photosensitive substrate P within an exposure area projected by the projection optical system PL on the photosensitive substrate P is exposed. Before the exposure, alignment and focusing measurements must be performed in order to ensure pattern accuracy and overlay accuracy. However, defocus and tilt errors often occur during the alignment and focusing measurements, which may lead to significant degradation of alignment accuracy and hence have adverse impact on the yield rate of the electronic devices being fabricated.

Technicians in this art have been seeking for a solution for this problem.

SUMMARY OF THE INVENTION

It is an object of the present invention to provide an exposure apparatus and a method for defocus and tilt error compensation, which allow good defocus and tilt error compensation and make alignment accuracy totally immune from defocus and tilt errors, through appropriate arrangement of alignment sensors and focusing sensors that works in combination with the defocus and tilt error compensation method.

The above object is attained by an exposure apparatus according to the present invention which includes: a plurality of first sensors arranged in a first direction and configured to detect a plurality of alignment marks on a substrate so as to obtain alignment information of the substrate; and a plurality of second sensors configured to detect focusing information of the substrate. Each of the plurality of first sensors corresponds to and has the same coordinate in a first direction as a respective one of the plurality of second sensors.

Optionally, the exposure apparatus may further include a plurality of projection objective lenses, each corresponding to and having the same coordinate in the first direction as each of a respective one of the plurality of first sensors and a respective one of the plurality of second sensors.

Optionally, the exposure apparatus may further include a mask stage for carrying a mask and a substrate stage for carrying the substrate, the plurality of projection objective lenses are configured to expose the substrate and thereby form an image of the mask on the substrate during movement of the mask on the mask stage in synchronization with the substrate on the substrate stage in a second direction, and wherein the second direction is perpendicular to the first direction.

Optionally, in the exposure apparatus, the plurality of second sensors may be evenly distributed on both sides, or be located on one side, of the plurality of first sensors.

Optionally, in the exposure apparatus, the plurality of projection objective lenses may be evenly distributed on both sides, or be located on one side, of the plurality of second sensors and the plurality of first sensors.

Optionally, in the exposure apparatus, the number of the plurality of second sensors, the number of the plurality of first sensors and the number of the alignment marks may be the same and be three or more.

Optionally, in the exposure apparatus, the substrate may be divided into a plurality of scanning exposure fields each including, along the second direction, two columns of alignment marks arranged along the first direction, wherein the second direction is perpendicular to the first direction, and wherein the number of alignment marks in each column is equal to the number of the plurality of first sensors so that the plurality of first sensors can simultaneously detect one column of alignment marks.

Optionally, in the exposure apparatus, each of the plurality of first sensors may include a broadband light source, an illumination lens group, a beam splitting prism, a front imaging lens group, an alignment mark, a rear imaging lens group and an image sensor, wherein the broadband light source emanates a light beam that passes through the illumination lens group, the beam splitting prism and the front imaging lens group and illuminates the alignment mark, and after being reflected by the alignment mark, it further propagates through the front imaging lens group, the beam splitting prism and the rear imaging lens group, thereby forming an image of the alignment mark on the image sensor, and wherein the image output from the image sensor is processed and used to obtain a position of the alignment mark that has been imaged.

Optionally, in the exposure apparatus, each of the plurality of second sensors can comprise a broadband light source, an illumination lens group, a projection mark, a first reflector, a projection imaging lens group, a detection imaging lens group, a second reflector and an image sensor, wherein the broadband light source produces a light beam that passes through the illumination lens group, then illuminates the projection mark, is then reflected by the first reflector, then propagates through the projection imaging lens, then forms an image of the projection mark on the surface of the substrate and is thereby reflected by the substrate, then propagates through the detection imaging lens group, is then reflected by the second reflector, and then forms the image of the projection mark on the image sensor, and wherein the image output from the image sensor is processed and used to obtain focusing information of the substrate.

The above object is also attained by a method for defocus and tilt error compensation, including the steps of:

providing a plurality of first sensors arranged in a first direction and configured to detect alignment marks on a substrate so as to obtain alignment information of the substrate;

providing a plurality of second sensors configured to detect focusing information of the substrate, wherein each of the plurality of first sensors corresponds to and has the same coordinate in the first direction as a respective one of the plurality of second sensors;

dividing the substrate into a plurality of scanning exposure fields, performing a scanning measurement on one of the scanning exposure fields using the plurality of first sensors and the plurality of second sensors, and detecting position information of a substrate stage that carries the substrate;

recording alignment information (Xj, Yj) of the scanning exposure field detected by each of the plurality of first sensors, focusing information Zi of the scanning exposure field detected by each of the plurality of second sensors, and the detected position information of the substrate stage based on the scanning measurement performed on the scanning exposure field;

calculating defocus and tilt errors $\Delta X$ of the plurality of first sensors along the first direction or defocus and tilt errors $\Delta Y$ of the plurality of first sensors along the second direction based on the recorded alignment information (Xj, Yj), focusing information Zi and the position information of the substrate stage, wherein the first direction is perpendicular to the second direction;

correcting the alignment information (Xj, Yj) based on the calculated defocus and tilt errors $\Delta X$ or $\Delta Y$ to obtain corrected alignment information (Xj', Yj'); and calculating an aligned position (X, Y) of the current scanning exposure field based on the corrected alignment information (Xj', Yj'), thereby completing the defocus and tilt error compensation, wherein i, j, j' are reference numbers of first sensors or second sensors, X represents the first direction, Y represents the second direction, and Z represents a direction that is perpendicular to a plane defined by the first and second directions.

Optionally, a relationship between the corrected alignment information (Xj', Yj') and the alignment information (Xj,Yj) before correction may be given by (Xj', Yj')=(Xj−$\Delta X$, Yj) or (Xj', Yj') (Xj, Yj−$\Delta Y$).

Optionally, in the method, calculating the defocus and tilt errors $\Delta X$ of the plurality of first sensors along the first direction or the defocus and tilt errors $\Delta Y$ of the plurality of first sensors along the second direction based on the recorded alignment information (Xj, Yj), the focusing information Zi and the position information of the substrate stage may include the steps of:

calculating an amount of defocusing $\Delta Z1$ with respect to an optimum measurement plane for the plurality of first sensors;

calculating tilts $\Phi x$ of measuring optical axes of the plurality of first sensors along the first direction or tilts $\Phi y$ of measuring optical axes of the plurality of first sensors along the second direction using an offline calibration process; and calculating the defocus and tilt errors $\Delta X$ along the first direction or the defocus and tilt errors $\Delta Y$ along the second direction according to $\Delta X=\Delta Z1 \tan(\Phi x)$ and $\Delta Y-\Delta Z1 \tan(\Phi y)$.

Optionally, in the method, calculating the amount of defocusing $\Delta Z1$ with respect to the optimum measurement plane for the plurality of first sensors may include the steps of:

determining the optimum measurement plane for the plurality of first sensors and a zero plane for the plurality of second sensors;

calculating an inherent deviation $\Delta Z0$ between the optimum measurement plane for the plurality of first sensors and the zero plane for the plurality of second sensors;

determining the positions of measuring locations of the plurality of first sensors and the positions of measuring locations of the plurality of second sensors on the substrate in the X or Y direction based on the position information of the substrate stage; and searching for the focusing information Zi based on the horizontal positions of the measuring locations, determining heights $\Delta Z2$ of the alignment marks, and calculating the amount of defocusing $\Delta Z1$ with respect to the optimum measurement plane, where $\Delta Z1=\Delta Z0-\Sigma 2$.

Optionally, in the method, calculating the tilts $\Phi x$ of the measuring optical axes of the plurality of first sensors along the first direction or the tilts $\Phi y$ of the measuring optical axes of the plurality of first sensors along the second direction using the offline calibration process may include the steps of:

horizontally moving the substrate stage in the exposure apparatus so as to enable the plurality of first sensors and the plurality of second sensors to measure an alignment reference plate carried on the substrate stage;

moving the substrate stage at least two steps along the Z axis and recording the measurement results of the plurality of second sensors and the measurement results of the plurality of first sensors after each step of movement;

determining deviations $\Delta X0$ along the X axis or deviations $\Delta Y0$ along the Y axis, between the measurement results obtained by the plurality of first sensors, and deviations $\Delta Z$ between the measurement results obtained by the plurality of second sensors, after every two successive steps of movement; and calculating the tilts $\Phi x$ along the first direction or the tilts $\Phi y$ along the second direction, wherein $\Phi x=\text{Arctan}(\Delta Y0/\Delta Z)$ and $\Phi y=-1*\text{Arctan}(\Delta X0/\Delta Z)$.

In the exposure apparatus and the method for defocus and tilt error compensation according to the present invention, each of the alignment sensors (first sensors) corresponds to and has the same coordinate in the first direction as a respective one of the focusing sensors (second sensors), so that each of the alignment sensors is arranged on the same straight line as a respective one of the focusing sensors. As such, the alignment marks can be characterized with both the focusing information and alignment information. This enables the correction of error(s) in the alignment information and thus achieves defocus and tilt error compensation, resulting in significant improvements in alignment accuracy and the production yield.

BRIEF DESCRIPTION OF THE DRAWINGS

In FIGS. 1 to 14:
100 denotes an illumination system; 200, a mask stage; 210, a mask; 300, a projection optical system; 300*a*, 300*b*, 300*c*, 300*d*, 300*e*, 300*f*, an array of projection objective lenses; 310*a*, 310*b*, 310*c*, 310*d*, 310*e*, 310*f*, exposure fields of the objective lenses; 910*a*, 910*b*, 910*c*, 910*d*, scanning exposure fields; 400, a substrate stage; 410, a substrate; 411, 411*a*, 411*b*, 411*c*, 411*d*, 411*e*, 411*f*, 412*a*, 412*b*, 412*c*, 412*d*, 412*e*, 412*f*, 413*a*, 413*b*, 413*c*, 413*d*, 413*e*, 413*f*, 414*a*, 414*b*, 414*c*, 414*d*, 414*e*, 414*f*, 415*a*, 415*b*, 415*c*, 415*d*, 415*e*, 415*f*, 416*a*, 416*b*, 416*c*, 416*d*, 4116*e*, 416*f*, 416A, 416B, 417*c*, 417*d*, 417*e*, 417*f*, 418*a*, 418*b*, 418*c*, 418*d*, 418*e*, 418*f*, alignment marks; 420, an alignment reference plate; 421, an alignment mark on the alignment reference plate; 500*a*, 500*b*, 500*c*, 500*d*, 500*e*, 500*f*, alignment sensors; 530, 530*a*, 530*b*, 530*c*, 530*d*, 530*e*, 530*f*, measuring locations of the alignment sensors; 600*a*, 600*b*, 600*c*, 600*d*, 600*e*, 600*f*, focusing sensors; 630, 630*a*, 630*b*, 630*c*, 630*d*, 630*e*, 630*f*, measuring locations of the focusing sensors; 553, a measuring optical axis of an alignment sensor; 653, a measuring optical axis of a focusing sensor; 551, a measuring location of an alignment sensor; 550, an optimum measurement plane for the alignment sensors; 650, a zero plane for the focusing sensors; 520, 620 broadband light sources; 521, 621, illumination lens groups; 522, a beam splitting prism; 523, a front imaging lens group; 524, a rear imaging lens group; 525, 627, image sensors; 622, a projection mark; 623, a first reflector; 624, a projection imaging lens group; 625, a detection imaging lens group; and 626, a second reflector.

DETAILED DESCRIPTION

Figure 1:
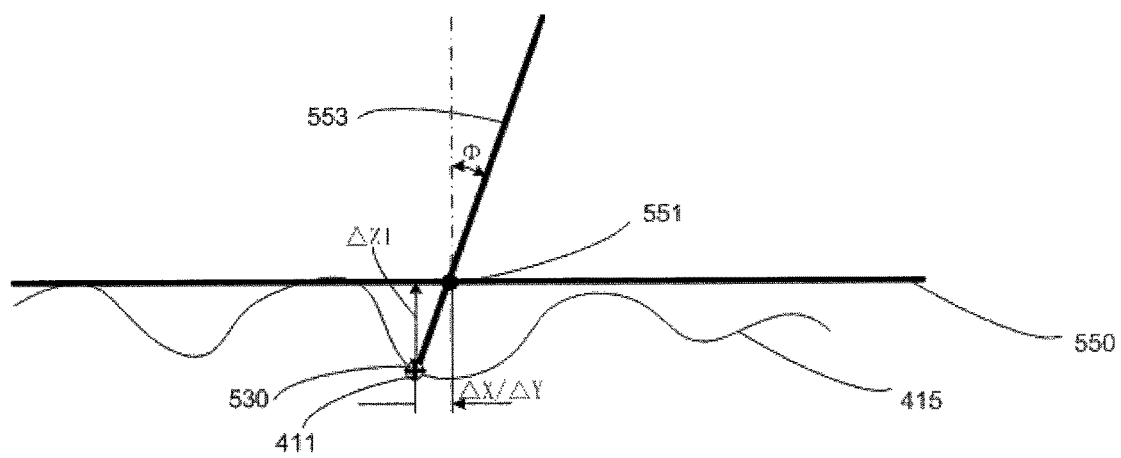
FIG. 1 is a schematic diagram explaining how a defocus and tilt error occurs.

The results of our experimental studies show that the occurrence of a defocus and tilt error is related majorly to an amount of defocusing as well as to a tilt of a measurement optical axis of an alignment sensor for alignment measurement. Specifically, reference may be made to FIG. 1, which explains how a defocus and tilt error occurs. In FIG. 1, 553 denotes the measuring optical axis of the alignment sensor, 550 indicates an optimum measurement plane for the alignment sensor, and 415 represents a substrate surface having a curved profile which leads to a deviation from the location 530 actually measured by the alignment sensor to the location 551 on the optimum measurement plane that is supposed to be measured. Thus, there is a vertical distance from the location 530 to the location 551, i.e., an amount of defocusing ΔZ1 with respect to the optimum measurement plane of the alignment sensor. In case there is a tilt Φ of the alignment sensor's measuring optical axis 553, a defocus and tilt error ΔX in the X-axis alignment measurement or a defocus and tilt error ΔY in the Y-axis alignment measurement will occur, where ΔX=ΔZ1*tan(Φ), or ΔY=ΔZ1*tan(Φ). From these equations, it is apparent that the defocus and tilt error is determined by the amount of defocusing ΔZ1 with respect to the optimum measurement plane of the alignment sensor and the tilt Φ of the measuring optical axis 553 of the alignment sensor. Therefore, the defocus and tilt error could be eliminated if either of the two determinants disappears. Generally, this could be made possible by either of the following two ways: 1) strict control over the measuring optical axis tilting of the alignment sensor which, however, is bound to raise the cost of alignment sensor development and manufacturing; and 2) strict control over substrate stage flatness and hence substrate surface flatness, which, however, will cause increased costs in substrate stage development and manufacturing and is expected not to be adapted for future flexible substrates.

Based on the knowledge about the defocus and tilt error obtained from related studies, as well as on the two determinants of the defocus and tilt error, i.e., the amount of defocusing ΔZ1 with respect to the optimum measurement plane of the alignment sensor and the tilt Φ of the measuring optical axis of the alignment sensor, it is proposed herein an exposure apparatus and a method for defocus and tilt error compensation in order to achieve higher alignment accuracy and address the needs of the semiconductor industry for high quality manufacturing.

Exposure apparatuses and methods for defocus and tilt error compensation according to specific embodiments of the present invention will be described below in further detail with reference to the accompanying drawings. Features and advantages of the invention will be more apparent from the following detailed description, as well as from the appended claims. Note that the accompanying drawings are provided in a very simplified form not necessarily presented to scale, with the only purpose of facilitating convenience and clarity in explaining the embodiments.

Figure 2:
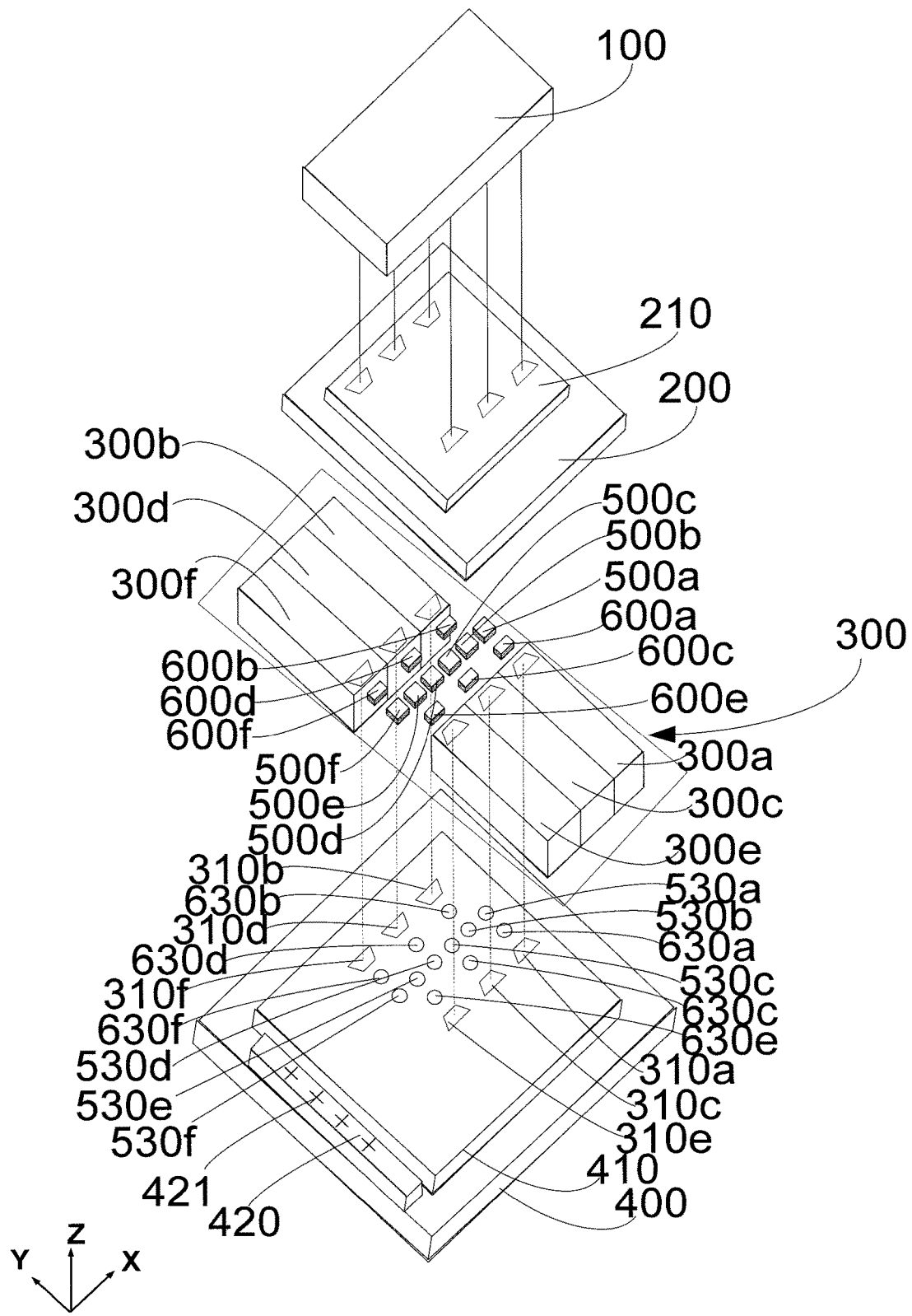
FIG. 2 is a schematic illustration of an exposure apparatus according to an embodiment of the present invention.

Reference is now made to FIG. 2, which is a schematic illustration of an exposure apparatus according to an embodiment of the present invention. As shown in the figure, the exposure apparatus includes a mask stage 200, an array of projection objective lenses 300 and a substrate stage 400. The apparatus further includes: a plurality of alignment sensors (first sensors) 500a, 500b, 500c, 500d, 500e, 500f which are arranged along a first direction and configured to sense substrate alignment information through detecting alignment marks on the substrate; and a plurality of focusing sensors (second sensors) 600a, 600b, 600c, 600d, 600e, 600f configured to sense substrate focusing information. Each of the alignment sensors is associated with and has the same coordinate in the first direction as a corresponding one of the focusing sensors. In addition, the exposure apparatus further includes an illumination system 100 for exposure.

Figure 3:
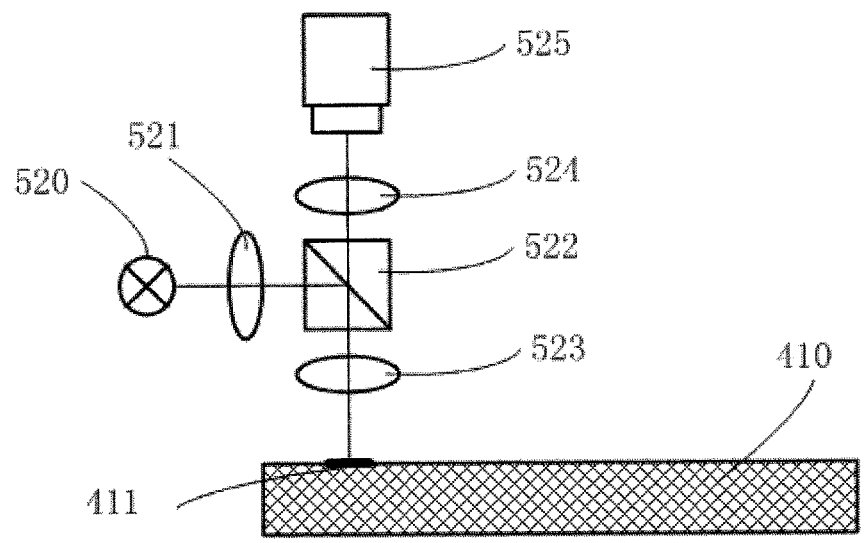
FIG. 3 is a schematic diagram illustrating a measurement performed by an alignment sensor in an exposure apparatus according to the present invention.

Reference is now made to FIG. 3, which is a schematic diagram illustrating a measurement performed by an alignment sensor of the exposure apparatus according to the present invention. As shown in the figure, the alignment sensor uses a broadband light source 520 which emanates a light beam that passes through an illumination lens group 521, a beam splitting prism 522 and a front imaging lens group 523 and illuminates an alignment mark 411. The light beam that is reflected from the alignment mark 411 and is to be measured passes through the front imaging lens group 523, the beam splitting prism 522 and the rear imaging lens group 524, forming an image of the alignment mark 411 on an image sensor 525. An image output from the image sensor 525 is processed and the current position of the alignment mark 411 is obtained therefrom. The approach employed by the alignment sensor according to this embodiment is a typical machine vision-based technique.

Figure 4:
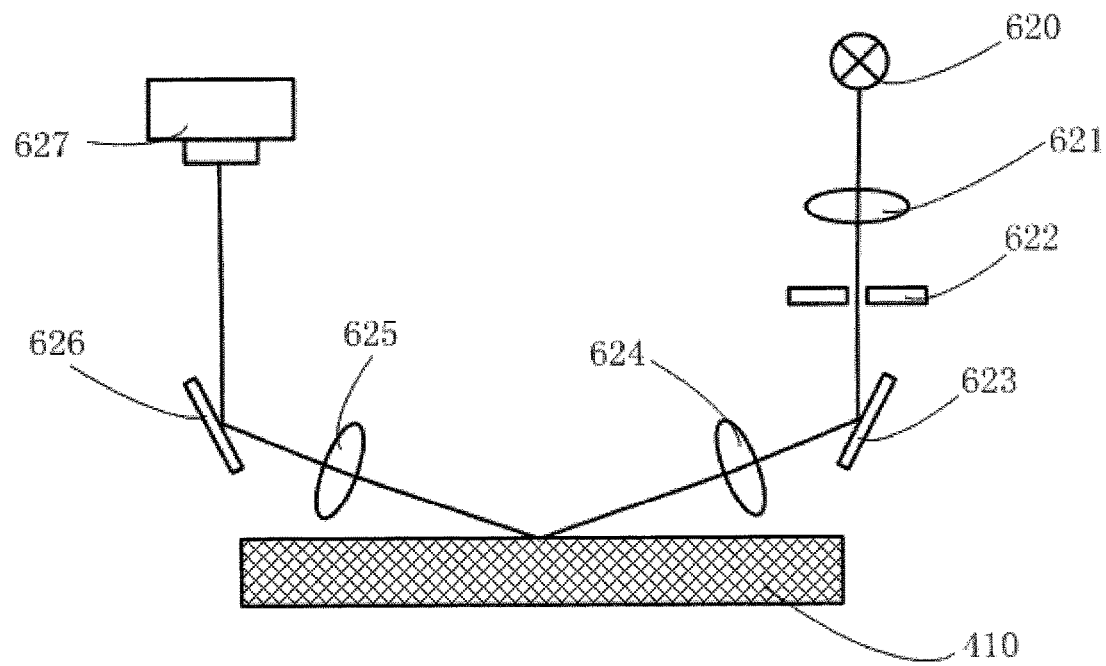
FIG. 4 is a schematic diagram illustrating a measurement performed by a focusing sensor in an exposure apparatus according to the present invention.

Reference is now made to FIG. 4, which is a schematic diagram illustrating a measurement performed by a focusing sensor of the exposure apparatus according to the present invention. As shown in the figure, the focusing sensor uses a broadband light source 620 which produces a light beam that passes through an illumination lens group 621 and hence illuminates a projection mark 622. After that, an image of the projection mark 622 is formed on the surface of a substrate with the aid of a first reflector 623 and a projection imaging lens group 624. The light beam that is reflected from the substrate and is to be measured propagates through a detection imaging lens group 625 and is reflected by a second reflector 626, thereby forming an image of the projection mark 622 on an image sensor 627. After being processed, the image is used to obtain information about current defocusing of the substrate. The approach employed by the focusing sensor according to this embodiment is a typical triangulation method.

Further, the array of projection objective lenses may be disposed in proximity of the focusing sensors and alignment sensors. Specifically, each projection objective lens in the array of projection objective lenses may correspond to and have the same coordinate in the first direction as each of a respective one of the focusing sensors and a respective one of the alignment sensors. Therefore, each of the alignment sensors and a corresponding one of the focusing sensors are aligned with a corresponding projection objective lens of the array of projection objective lenses along the same straight line and are thus made possible to be located closer to an exposure field of the objective lens, which results in an improvement in alignment accuracy.

Preferably, the array of projection objective lenses is evenly distributed on both sides, or is situated on one side, of the plurality of focusing sensors and the plurality of alignment sensors.

With continued reference to FIG. 2, the mask stage 200 carries a mask 210. When the mask stage 200 moves with the substrate stage 400 in synchronization in a second direction, i.e., when the mask 210 on the mask stage 200 moves synchronously with a substrate 410 on the substrate stage 400 in the second direction, the array of projection objective lenses 300a, 300b, 300c, 300d, 300e, 300f exposes the substrate 410, forming an image of the mask 210 on the substrate 410, wherein the first direction is perpendicular to the second direction. In this embodiment, the array of projection objective lenses is divided into two groups. Each of the groups has three projection objective lenses arranged along the first direction, while the two groups are arranged along the Y axis. Between the two groups of projection objective lenses, are disposed six alignment sensors 500a, 500b, 500c, 500d, 500e, 500f and six focusing sensors 600a, 600b, 600c, 600d, 600e, 600f. The six alignment sensors are disposed along the X axis, and each of them is associated with and has the same coordinate in the first direction (i.e., on the X axis) as a respective one of the focusing sensors.

Figure 8:
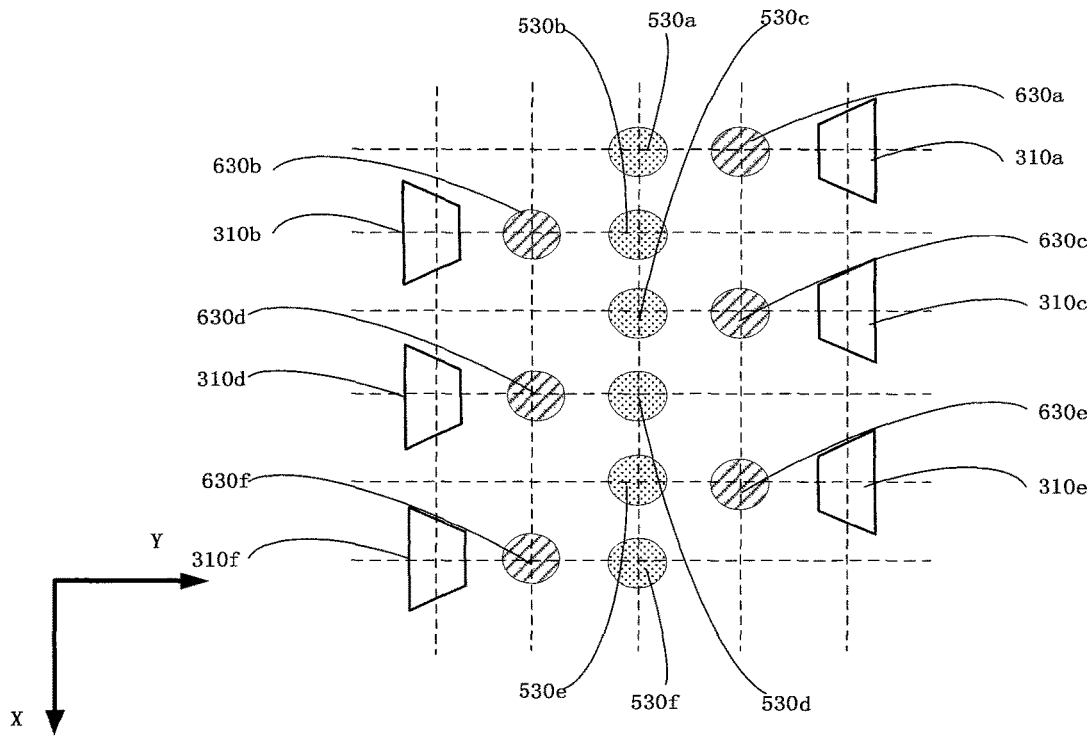
FIG. 8 is a schematic diagram showing a distribution of measuring locations of alignment sensors and measuring locations of focusing sensors according to the present invention.

Reference is now made to FIG. 2, as well as to FIG. 8 which is a schematic diagram showing a distribution of measuring locations of the alignment sensors and measuring locations of the focusing sensors in accordance with the present invention. With combined reference to FIGS. 2 and 8, the six alignment sensors (i.e., 500a, 500b, 500c, 500d, 500e, 500f) correspond to their respective measuring locations 530a, 530b, 530c, 530d, 530e, 530f and the six focusing sensors (i.e., 600a, 600b, 600c, 600d, 600e, 600f) correspond to respective measuring locations 630a, 630b, 630c, 630d, 630e, 630f, on the substrate 410. The measuring locations 630a, 630b, 630c, 630d, 630e, 630f are distributed in correspondence to exposure fields 310a, 310b, 310c, 310d, 310e, 310f of the objective lenses. As each of the alignment sensors corresponds to and has the same coordinate in the first direction (i.e., on the X axis, in this embodiment) as a respective one of the focusing sensors, the X-axis coordinates of the measuring locations of the alignment sensors are the same as the coordinates in the first direction of the measuring locations of the respective focusing sensors and their Y-axis coordinates may be either greater or smaller than Y-axis coordinates thereof.

The number of the focusing sensors may be three or more and is equal to the number of the alignment sensors and to the number of the alignment marks. The plurality of focusing sensors may be evenly distributed on both sides, or be located on one side of, the plurality of alignment sensors.

Figure 7:
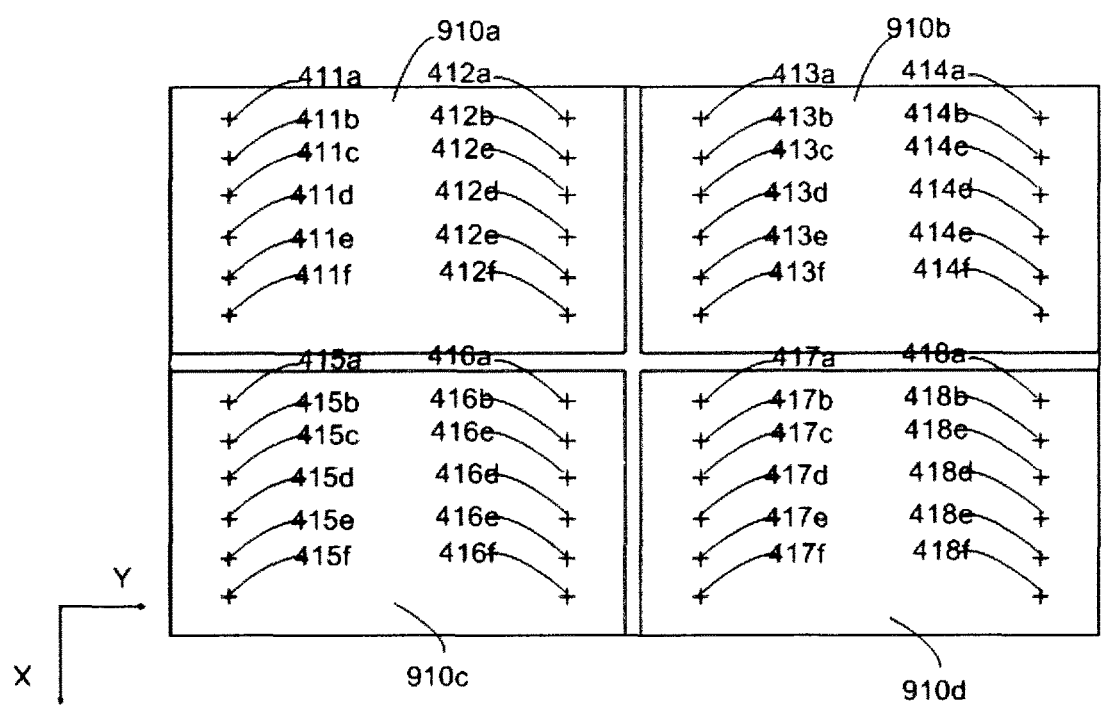
FIG. 7 schematically illustrates distributions of alignment marks on a substrate and scanning exposure fields in accordance with an embodiment of the present invention.

Reference is now made to FIG. 7, which schematically illustrates distributions of alignment marks and scanning exposure fields in accordance with one embodiment of the present invention. As shown in the figure, the substrate is divided into four scanning exposure fields (i.e., 910a, 910b, 910c, 910d), in each of which, there are arranged in the second direction two columns of alignment marks. Alignment marks in each of the columns are arranged along the first direction. The first direction is perpendicular to the second direction. The number of alignment marks in each of the columns is equal to the number of the alignment sensors so that the plurality of alignment sensors can simultaneously detect one column of alignment marks. It is a matter of course that the substrate may also be divided into a different number of scanning exposure fields from that described in this embodiment. The substrate may be divided into multiple scanning exposure fields according to practical needs.

Figure 5:
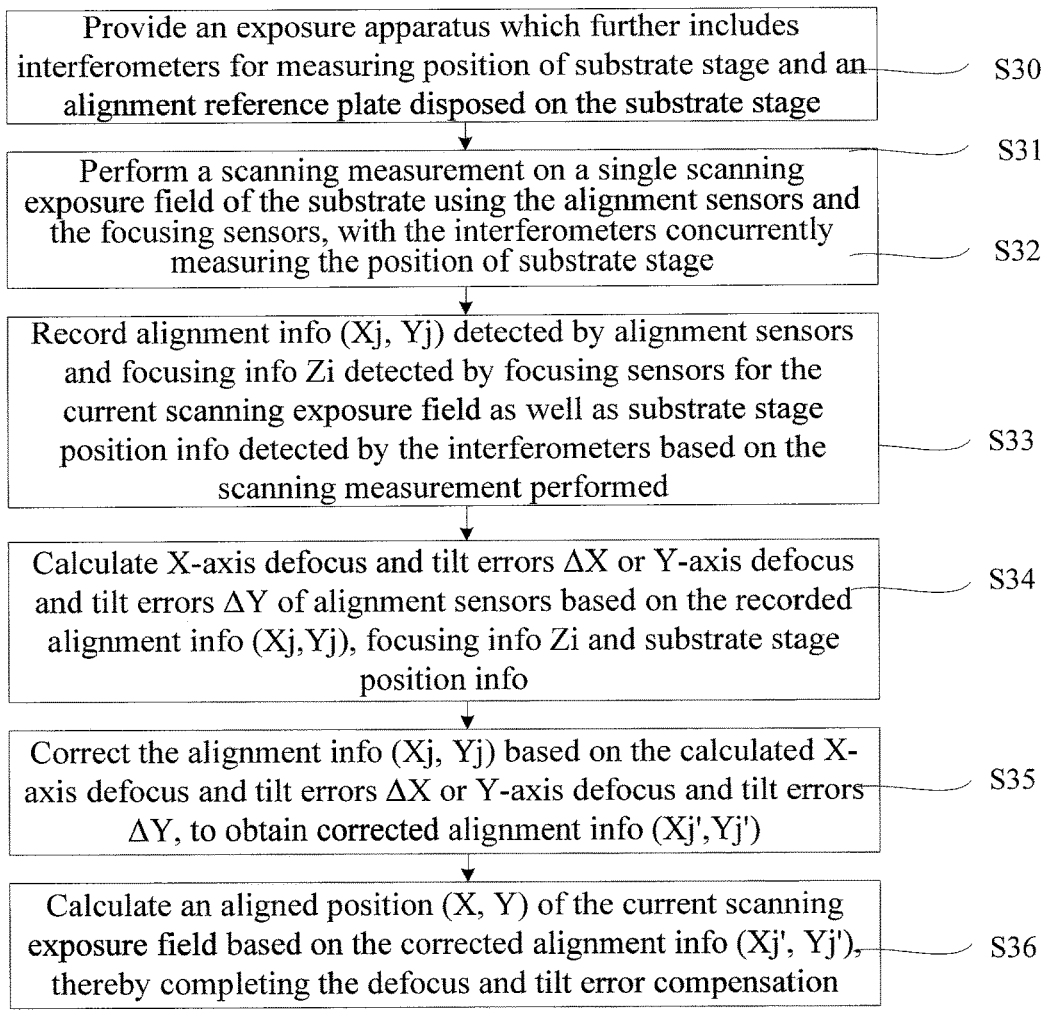
FIG. 5 is a graphical flowchart illustrating a method for defocus and tilt error compensation according to the present invention.

Reference is now made to FIG. 5, which is a graphical flowchart illustrating a method for defocus and tilt error compensation. As shown in the figure, the method includes the steps as described below.

At first, in step S30, an exposure apparatus as described above is provided which further comprises interferometers for measuring the position of the substrate stage and an alignment reference plate disposed on the substrate stage.

Subsequently, in step S31, a scanning measurement is performed on a single scanning exposure field of the substrate using the alignment sensors and the focusing sensors, with the interferometers concurrently measuring the substrate stage position.

Next, in step S32, based on the scanning measurement performed on the single scanning exposure field, scanning exposure field alignment information (Xj, Yj) detected by the alignment sensors, scanning exposure field focusing information Zi detected by the focusing sensors and substrate stage position information measured by the interferometers is recorded.

Figure 9A:
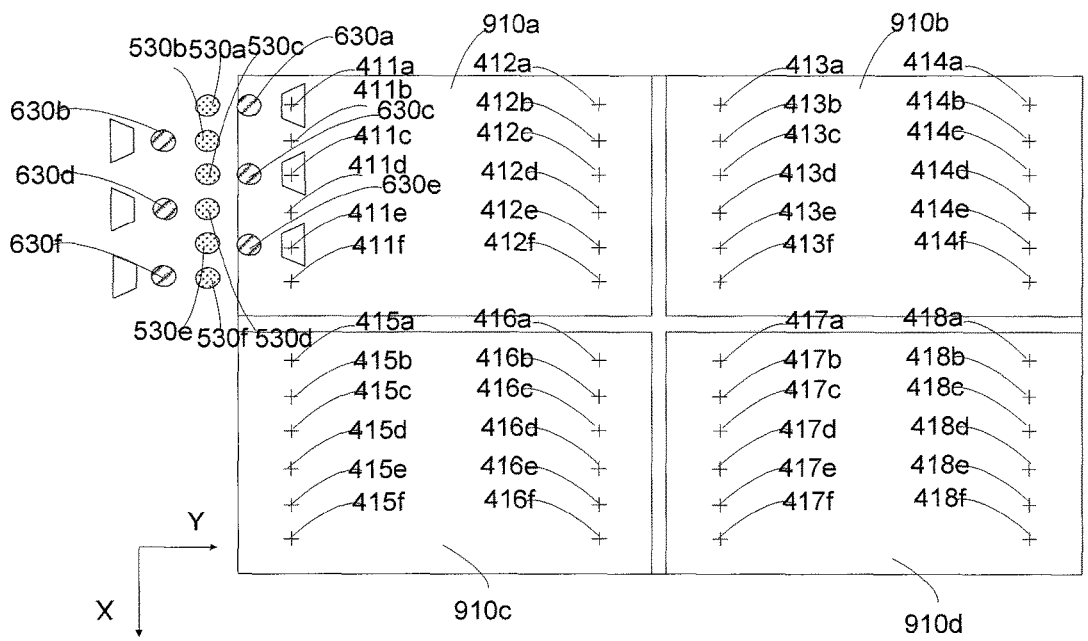
FIG. 9A schematically illustrates a scanning measurement performed on a scanning exposure field using an exposure apparatus according to the present invention.

A scanning measurement performed on a scanning exposure field using the exposure apparatus according to this embodiment is schematically illustrated in FIG. 9A, in which 910a, 910b, 910c, 910d represent scanning exposure fields corresponding to respective areas of the substrate 410 provided thereon with alignment marks 411a, 411b, 411c, 411d, 411e, 411f; 412a; 412b, 412c, 412d, 412e, 412f; 413a, 413b, 413c, 413d, 413e, 413f; 414a, 414b, 414c, 414d, 414e, 414f; 415a, 415b, 415c, 415d, 415e, 415f; 416a, 416b, 416c, 416d, 4116e, 416f; and 417a, 417b, 417c, 417d, 417e, 417f, 418a, 418b, 418c, 418d, 418e, 418f.

Figure 9B:
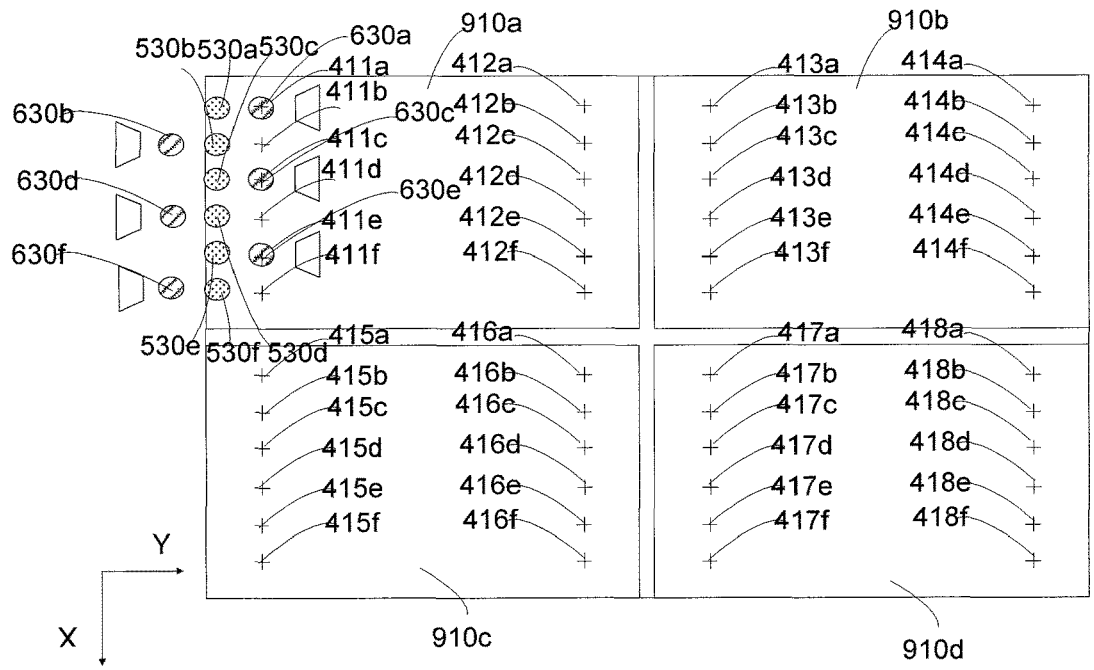
FIG. 9B is a schematic illustration of a focusing measurement carried out by an exposure apparatus according to the invention.
Figure 9C:
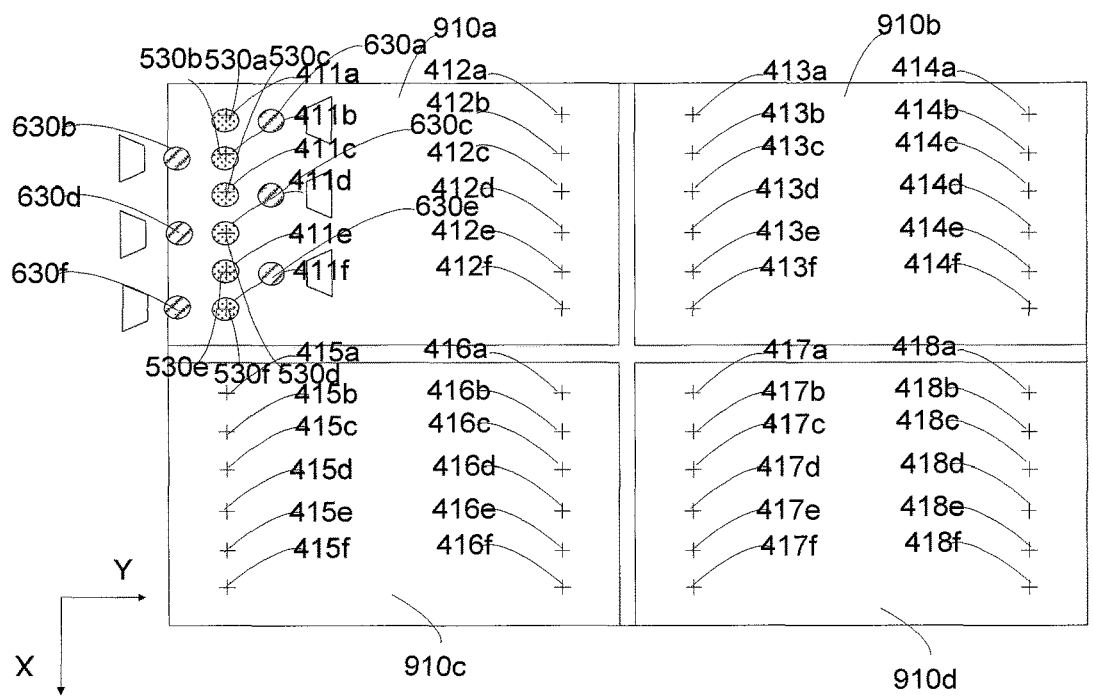
FIG. 9C is a schematic illustrating an alignment measurement carried out by an exposure apparatus according to the invention.

Reference is now made to FIG. 9B, a schematic illustration of a focusing measurement carried out by the exposure apparatus of the invention, and to FIG. 9C, a schematic illustrating an alignment measurement conducted using the exposure apparatus of the invention. As shown in FIGS. 9B and 9C, with the scanning exposure field 910a as an example, the substrate stage is moved in the second direction (i.e., along the Y axis, in accordance with the embodiment). Upon the measuring locations 630a, 630c, 630e of the focusing sensors entering the scanning exposure field 910a, recording of the substrate stage position and real-time focusing information Zi of the scanning exposure field 910a is initialized. In this embodiment, the focusing information includes Za, Zb, Zc, Zd, Ze and Zf. Since each alignment sensor corresponds to and has the same coordinate in the first direction as a respective focusing sensor, the X-axis coordinate of the measuring location of the alignment sensor is the same as the coordinate in the first direction of the measuring location of its respective focusing sensor. Therefore, during the movement of the substrate stage, the alignment marks within the current scanning exposure field successively enters field of view (FoV) areas of the focusing sensors at the measuring locations so that heights of all the alignment marks, i.e., focusing information of the alignment marks, can be obtained. When the measuring locations of the focusing sensors are no longer completely within the area of the substrate 410, the focusing measurement for the current scanning exposure field is ended, and a new scanning measurement is started for a next scanning exposure field on the substrate 410 that has not been measured.

With continued reference to FIGS. 9B and 9C, upon the first column of alignment marks 411a, 411b, 411c, 411d, 411e, 411f enters respective FoV areas at the measuring locations 530a, 530b, 530c, 530d, 530e, 530f of the alignment sensors, as shown in FIG. 9C, movement of the substrate stage is stopped and an alignment measurement is initialized to obtain corresponding alignment information (Xj,Yj), where Xj denotes the X-axis coordinate of a measuring location, and Yj is the Y-axis coordinate thereof. In this embodiment, the corresponding alignment information includes (Xa1, Ya1), (Xb1, Yb1), (Xc1, Yc1), (Xd1, Yd1), (Xe1, Ye1) and (Xf1, Yf1). After the completion of the alignment measurement on the first column of alignment marks, the substrate stage is again moved from the right to the left along the Y axis. Similarly, when the second column of alignment marks 412a, 412b, 412c, 412d, 412e, 412f enter the respective measuring locations 530a, 530b, 530c, 530d, 530e, 530f of the alignment sensors, movement of the substrate stage is stopped and another alignment measurement is initialized to obtain corresponding alignment information (Xj,Yj). In this embodiment, this corresponding alignment information includes (Xa2 Ya2), (Xb2, Yb2), (Xc2, Yc2), (Xd2, Yd2), (Xe2, Ye2) and (Xf2, Yf2). This measurement is then repeated on each of the remaining scanning exposure fields on the substrate 410 that have not been measured, followed by recording of corresponding alignment information.

After that, in step S33, based on the recorded alignment information (Xj,Yj), focusing information Zi and substrate stage position information, X-axis defocus and tilt errors ΔX or Y-axis defocus and tilt errors ΔY of the alignment sensors are calculated.

Referring back to FIG. 1, a tilt of the measuring optical axis 553 of an alignment sensor and a curved profile of the substrate 410 will lead to a defocus and tilt error in the alignment information obtained in step S32. According to the present invention, the defocus and tilt error is reduced through calculating its value and compensating for it.

Figure 6A:
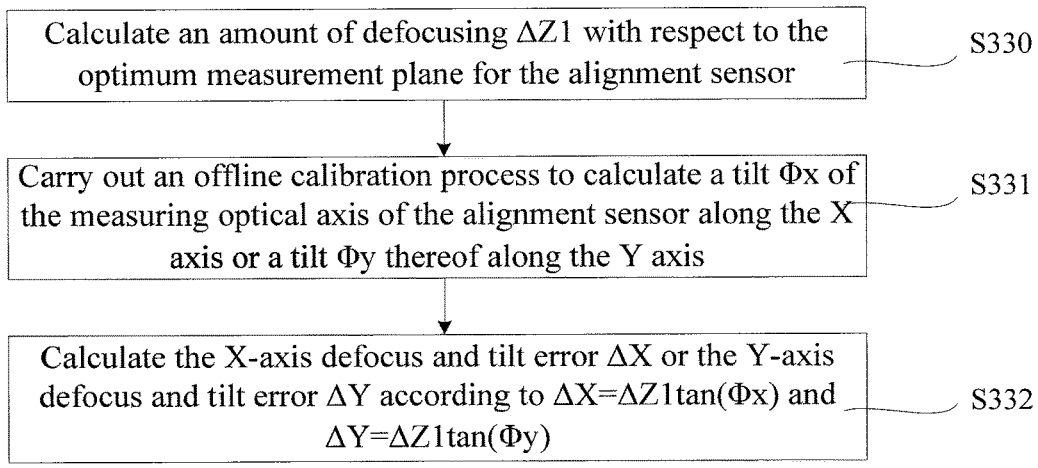
FIG. 6A schematically illustrates a detailed process of step S33 of FIG. 5

Specifically, reference is now made to FIG. 6A, which diagrammatically illustrates a detailed process of step S33 of FIG. 5. As shown in FIG. 6A, step S33 may further comprise the following steps.

At first, in step S330, an amount of defocusing ΔZ1 with respect to the optimum measurement plane for the alignment sensor is calculated.

Figure 6B:
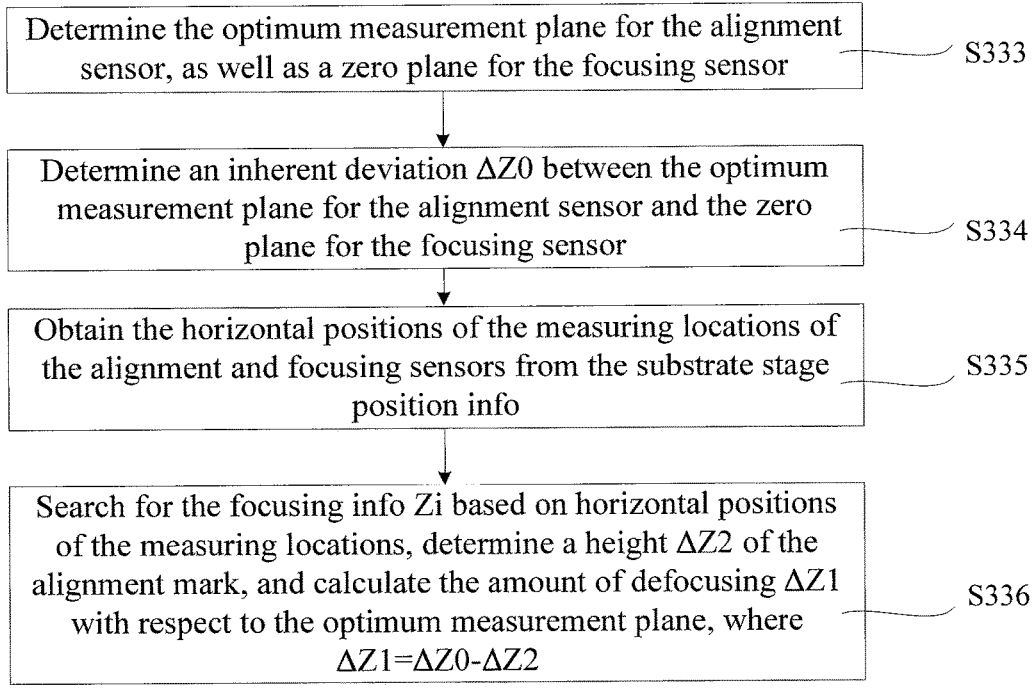
FIG. 6B schematically illustrates a detailed process of step S330 of FIG. 6A.

Further, with reference to FIG. 6B which diagrammatically illustrates a detailed process of step S330 of FIG. 6A, step S330 may further comprise the following steps.

At first, in step S333, the optimum measurement plane for the alignment sensor, as well as a zero plane for the focusing sensor, is determined.

Figure 10:
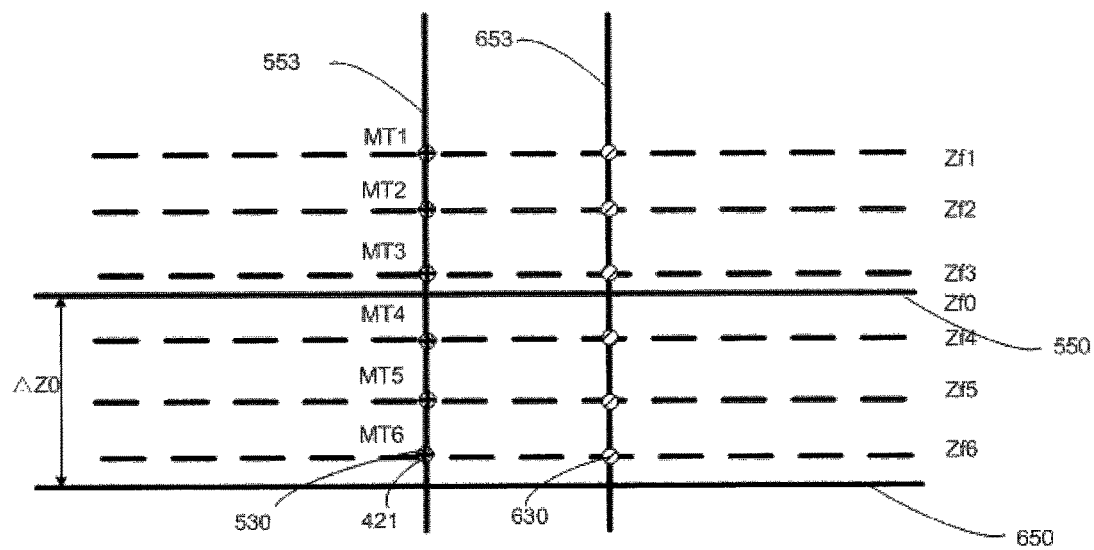
FIG. 10 is a schematic illustration of the determination of an optimum measurement plane for an alignment sensor, as well as of an inherent deviation ΔZ0.

In particular, reference is now made to FIG. 10, which is a schematic illustration of the determination of the optimum measurement plane for the alignment sensor and an inherent deviation ΔZ0. As shown in FIG. 10, the substrate stage is moved horizontally so as to enable performance of measurements on the alignment reference plate 420 on the substrate stage using the measuring location 530 of the alignment sensor and the measuring location 630 of the focusing sensor. Wherein, when an alignment mark 421 on the alignment reference plate 420 enters a FoV area at the measuring location 530 of the alignment sensor, an alignment measurement is performed on the alignment mark 421 using the measuring location of the alignment sensor. The substrate stage 420 is moved vertically at least three steps. In this embodiment, the explanation is made with the substrate stage 420 being moved six steps and the measurement being performed on only one focusing sensor and only one alignment sensor in the exposure apparatus as an example. Following each step of movement, focusing information Zf1, Zf2, Zf3, Zf4, Zf5, Zf6 obtained by the focusing sensor is recorded. Meanwhile, following each step of movement, contrast values MT1, MT2, MT3, MT4, MT5, MT6 of the alignment mark 421 on the alignment CCD 525 are obtained using the alignment sensor. A parabolic fit is applied to the contrast values MT1, MT2, MT3, MT4, MT5, MT6 and the focusing information Zf1, Z12, Zf3, Zf4, Zf5, Zf6 to identify the position of the alignment mark 421 corresponding to the highest contrast value, i.e., the position of the optimum measurement plane 550 for the alignment sensor. The zero plane 600 of the focusing sensor may be further determined based on the focusing information.

Thereafter, in step S334, the inherent deviation ΔZ0 from the optimum measurement plane for the alignment sensor to the zero plane for the focusing sensor is calculated. Here, the vertical distance between the optimum measurement plane for the alignment sensor and the zero plane for the focusing sensor is determined as the inherent deviation ΔZ0 from the optimum measurement plane for the alignment sensor to the zero plane for the focusing sensor.

Subsequently, in step S335, the horizontal positions of the measuring locations of the alignment and focusing sensors are obtained from the substrate stage position information.

Next, in step S336, based on the horizontal positions of the measuring locations, a search is made for the focusing information Zi, from which the height ΔZ2 of the alignment mark is determined, followed by calculation of the amount of defocusing ΔZ1 with respect to the optimum measurement plane, where ΔZ1=ΔZ0−ΔZ2.

With continued reference to FIGS. 9A to 9C, the focusing information Zi indicates a result of the measurement performed by the focusing sensor on the alignment mark, i.e., a value of the height of the alignment mark.

The horizontal positions of the measuring locations of the alignment and focusing sensors can be found in the results of the substrate stage position measurements carried out by the interferometers, based on which the focusing information Zi indicative of the height value of the alignment mark can be determined.

Afterward, in step S331, an offline calibration process is carried out to calculate a tilt Φx of the measuring optical axis of the alignment sensor along the X axis or a tilt Φy thereof along the Y axis.

Figure 6C:
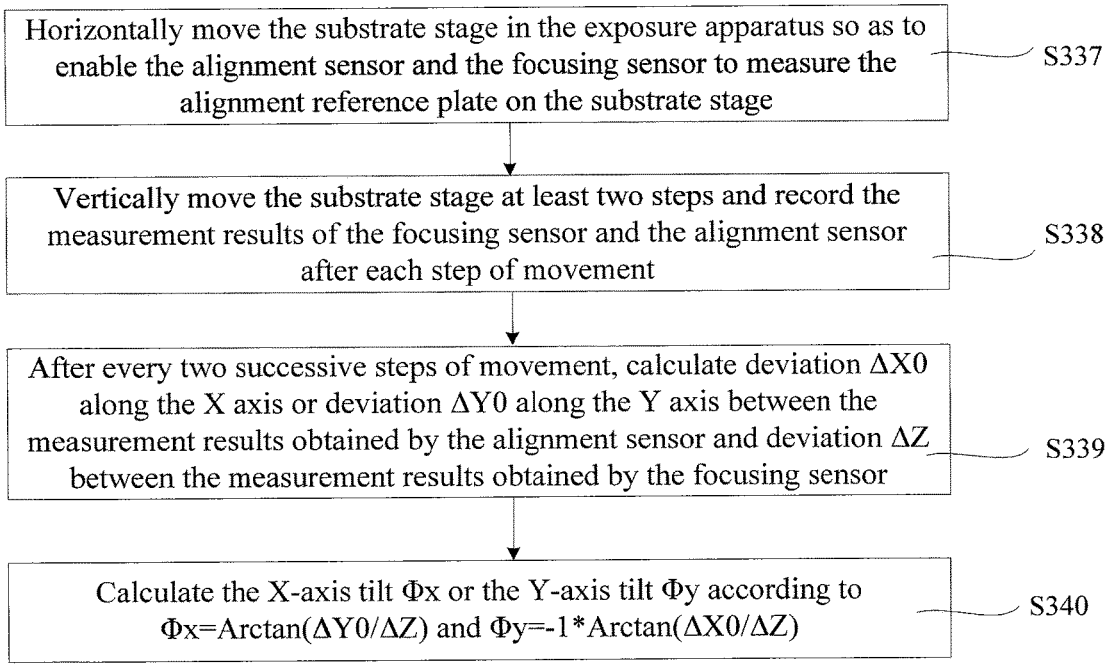
FIG. 6C schematically illustrates a detailed process of step S331 of FIG. 6A.

For the two forms of the tilt Φ of the measuring optical axis, i.e., the tilt Φx along the X axis and the Φy along the Y axis, different analysis and calibration processes are carried out. Reference is now made to FIG. 6C, which diagrammatically illustrates a detailed process of step S331 of FIG. 6A. As shown in FIG. 6C, step S331 may further comprise the following steps.

First of all, in step S337, the substrate stage in the exposure apparatus is moved horizontally so as to enable performance of measurements on the alignment reference plate on the substrate stage by the alignment sensor and the focusing sensor.

After that, in step S338, the substrate stage is moved vertically at least two steps and the measurement results of the focusing sensor and the alignment sensor are recorded after each step of movement.

Subsequently, in step S339, deviation ΔX0 along the X axis or deviation ΔY0 along the Y axis between the measurement results obtained by the alignment sensor and deviation ΔZ between the measurement results obtained by the focusing sensor, after every two successive steps of movement, are calculated.

Next, in step S340, the tilt Φx along the X axis or the tilt Φy along the Y axis are calculated according to Φx=Arctan(ΔY0/ΔZ) and Φy=−1*Arctan(ΔX0/ΔZ).

Figure 11:
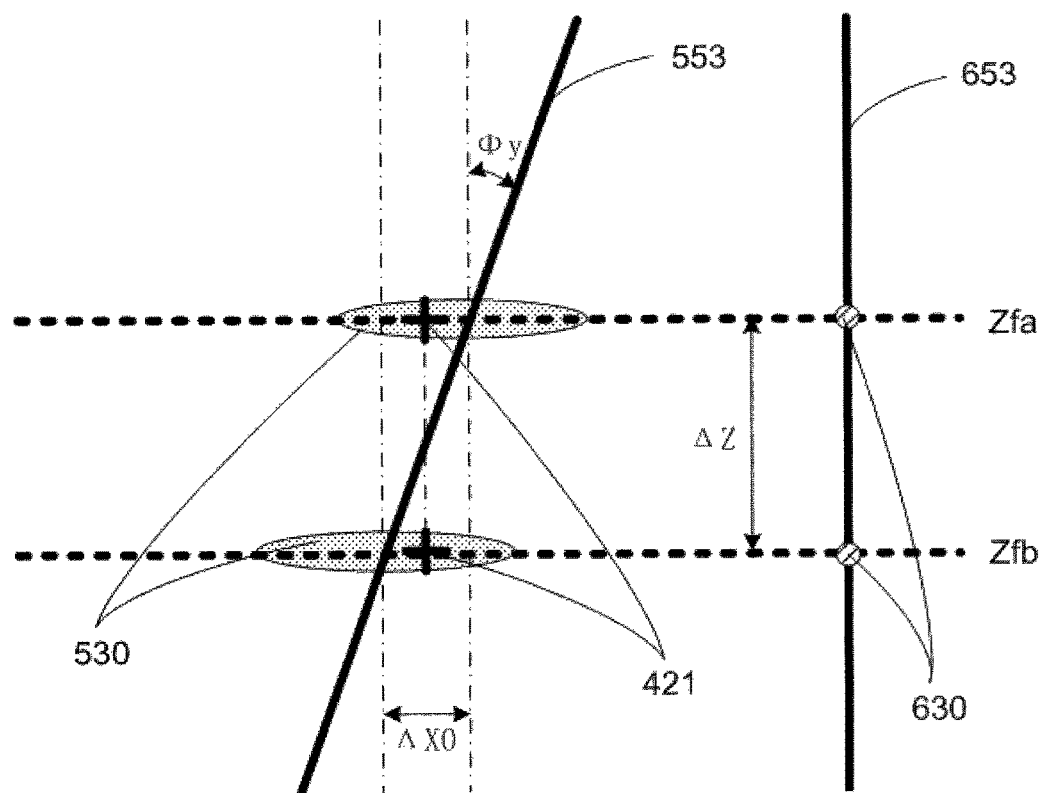
FIG. 11 is a schematic illustration of an offline calibration process performed when there is a tilt of a measuring optical axis of the alignment sensor.

Reference is now made to FIG. 11, a schematic illustration of an offline calibration process performed when there is a tilt of the measuring optical axis of the alignment sensor. As shown in the figure, the substrate stage is moved horizontally so as to enable performance of measurements on the alignment reference plate 420 on the substrate stage using the measuring location 530 of the alignment sensor and the measuring location 630 of the focusing sensor. The alignment mark 421 provided on the alignment reference plate 420 serves as a basis for the offline calibration process for determining the tilt of the measuring optical axis 553 of the alignment sensor. Upon the alignment mark 421 on the alignment reference plate 420 entering the FoV area at the measuring location 530 of the alignment sensor, an alignment measurement is carried out on the alignment mark 421 using the measuring location of the alignment sensor. The substrate stage 420 is vertically moved at least two successive steps. In this embodiment, the explanation is made with the substrate stage 420 being moved two steps and the measurement being performed using only one focusing sensor and only one alignment sensor in the exposure apparatus as an example. Following each step of movement, the measurement results Zfa, Zfb of the focusing sensor are recorded. Meanwhile, following each step of movement, alignment information of the alignment mark 421 is obtained by the alignment sensor. If there is a tilt Φy of the measuring optical axis 553, there will be a deviation ΔX0 along the X axis between the alignment measurement results obtained after the two steps of movement. If we define ΔZ=Zfa−Zfb, then Φy=−1*Arctan(ΔX0/ΔZ). Similarly, if there is a tilt Φx of the measuring optical axis 553, there will be a deviation ΔY0 along the Y axis between the alignment measurement results obtained after the two steps of movement. If we define ΔZ=Zfa−Zfb, then Φx=Arctan(ΔY0/ΔZ).

Figure 12:
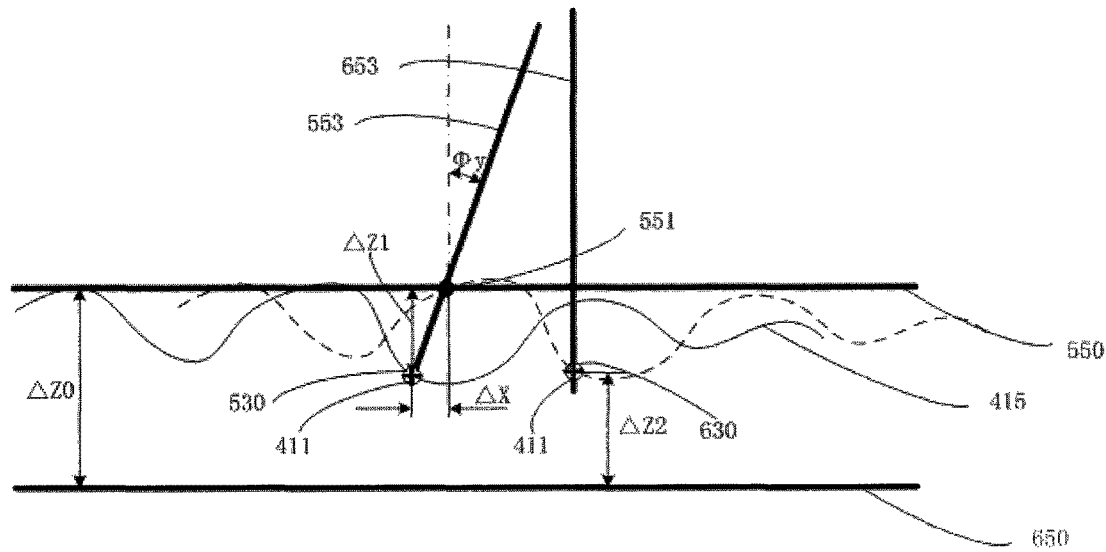
FIG. 12 is a schematic illustration of compensation for a defocus and tilt error caused by a tilt of the measuring optical axis of the alignment sensor along the X axis.
Figure 13:
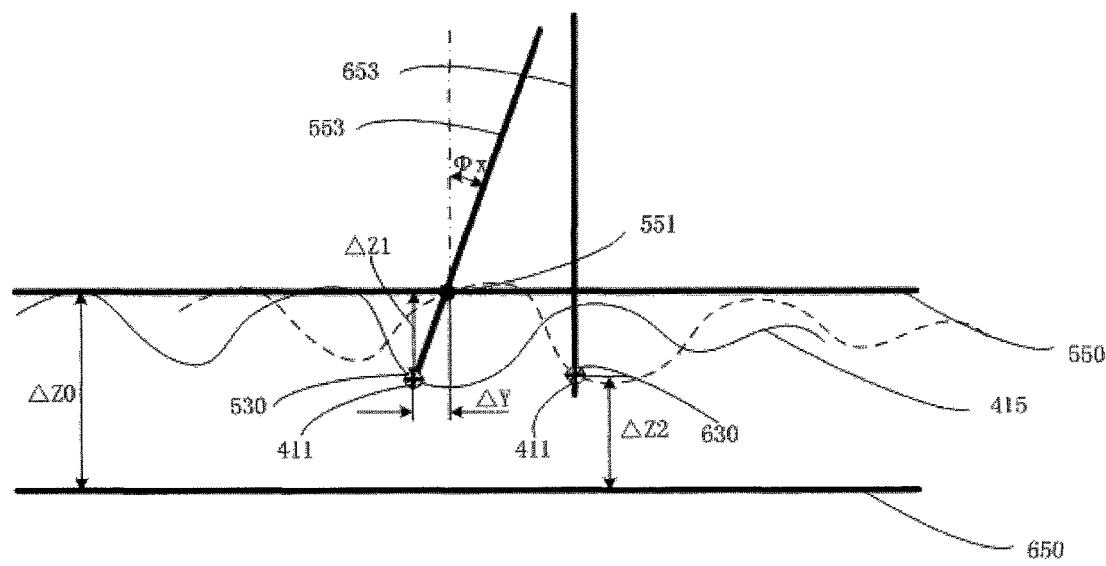
FIG. 13 is a schematic illustration of compensation for a defocus and tilt error caused by a tilt of the measuring optical axis of the alignment sensor along the Y axis.

Reference is now made to FIG. 12, which is a schematic illustration of compensation for a defocus and tilt error caused by a tilt of the measuring optical axis of the alignment sensor along the X axis, and to FIG. 13, which is a schematic illustration of compensation for a defocus and tilt error caused by a tilt of the measuring optical axis of the alignment sensor along the Y axis. As shown in FIGS. 12 and 13, in step S332, the defocus and tilt error ΔX along the X axis or the defocus and tilt error ΔY along the Y axis is calculated according to ΔX=ΔZ1 tan(Φx) and ΔY=ΔZ1 tan(Φy). In this embodiment, as there is no tilt of the measuring optical axis 653 of the focusing sensors, the height ΔZ2 of the alignment mark can be determined based upon the measurement results (i.e., the focusing information) obtained at the measuring location 630 by the focusing sensor.

Thereafter, in step S34, based on the calculated defocus and tilt error ΔX along the X axis or the defocus and tilt error ΔY along the Y axis, the alignment information (Xj, Yj) is amended to obtain new alignment information (Xj',Yj').

Further, the new alignment information (Xj',Yj') is calculated based on the alignment information (Xj,Yj) according to (Xj', Yj')=(Xj−ΔX, Yj) or (Xj', Yj')=(Xj, Yj−ΔY).

Subsequently, in step S35, a focused position Z and an aligned position (X,Y) are calculated based on the focusing information Zi and the new alignment information (Xj', Yj'), respectively. Wherein, the focused position Z may be calculated using a fitting method based on the focusing information Zi of the current scanning exposure field, and the aligned position (X,Y) may be calculating using a fitting method based on the new alignment information (Xj', Yj').

Afterward, in step S35, the compensation for the defocus and tilt error is completed after the aligned position (X,Y) of the current scanning exposure field is calculated based on the new alignment information (Xj', Yj').

Specifically, since there is no error existing in the focusing information, and because the alignment information has been amended (i.e., the defocus and tilt error therein has been compensated for), the calculated focused position Z and aligned position (X,Y) are accurate and result in higher alignment accuracy. It has been practically confirmed that, with the compensation method according to the present invention, an improvement of about 30 nm in alignment accuracy was achieved over the prior art for the condition in which there was an amount of optimum measurement plane defocusing $\Delta Z1$ of 10 μm and an optical axis tilt $\Phi$ of 3 mrad.

Figure 14:
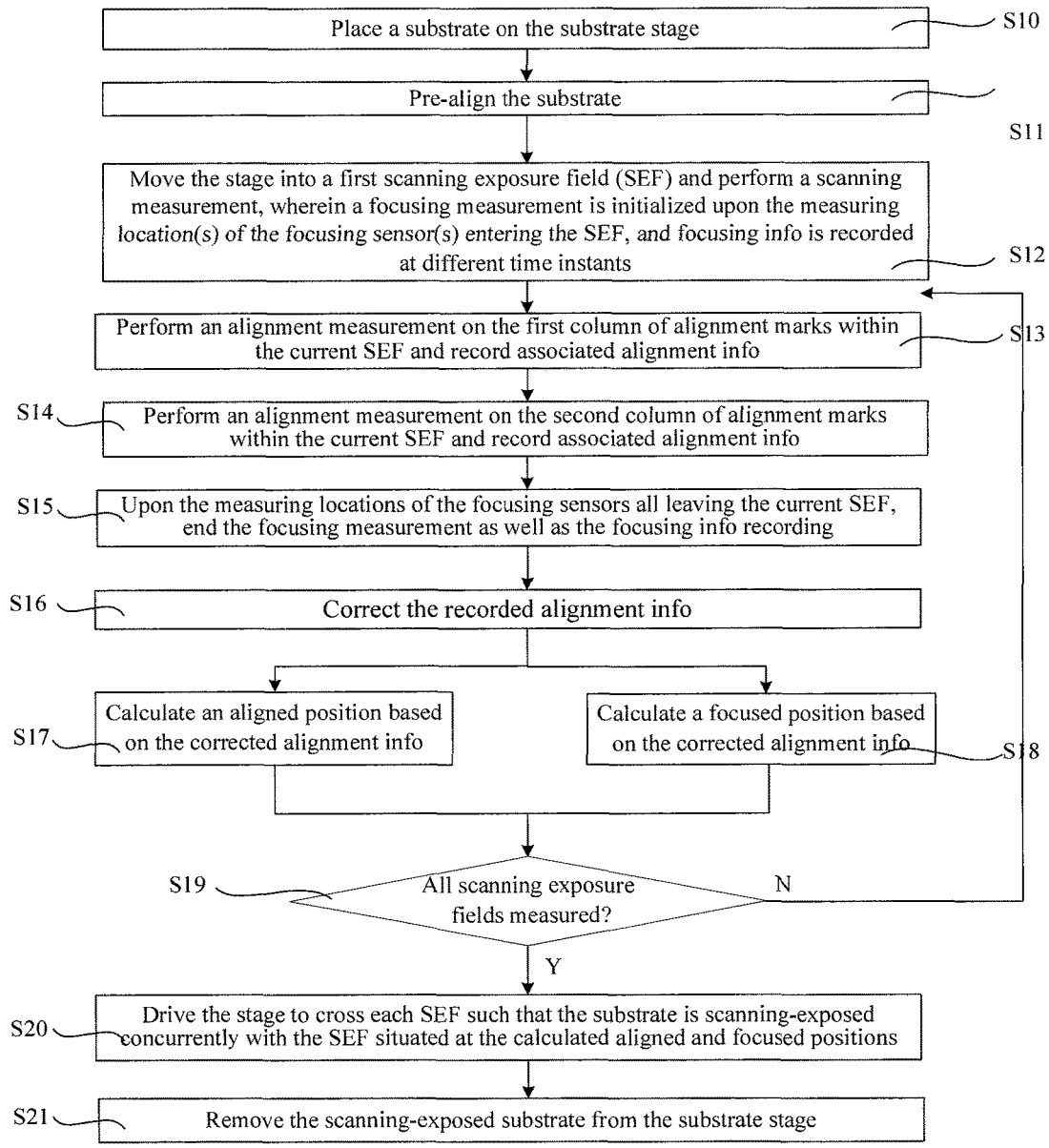
FIG. 14 graphically illustrates a flowchart of an exposure process performed by an exposure apparatus according to the present invention.

In order for the above description to be better understood, reference is now made to FIG. 14, which graphically illustrates a flowchart of an exposure process performed by an exposure apparatus according to the present invention. As shown in the figure, the exposure process may comprise the steps as described below.

At first, in step S10, a substrate is placed on the substrate stage.

Subsequently, the substrate is pre-aligned in step S11.

After that, in step S12, the substrate stage is moved into a first scanning exposure field and a scanning measurement is performed thereon, wherein a focusing measurement is initialized upon the measuring location of any of the focusing sensors entering the scanning exposure field, and focusing information is recorded at different time instants.

Afterward, in step S13, an alignment measurement is carried out on the first column of alignment marks within the current scanning exposure field, and associated alignment information is recorded.

Thereafter, in step S14, an alignment measurement is carried out on the second column of alignment marks within the current scanning exposure field, and associated alignment information is recorded.

Next, in step S15, upon the measuring locations of the focusing sensors all leaving the current scanning exposure field, the focusing measurement is ended, as well as the focusing information recording.

Subsequently, in step S17, the alignment information is amended and an aligned position is calculated based on the new alignment information.

After that, in step S18, a focused position is calculated based on the recorded focusing information.

Next, in step S19, it is determined whether all scanning exposure fields have been measured. If true, then the process proceeds to S20. Otherwise, it loops back to step S13.

Afterward, in step S20, the substrate stage is driven to cross each scanning exposure field such that the substrate is scanning-exposed concurrently with the scanning exposure field situated at the calculated aligned and focused positions.

Thereafter, in step S21, the scanning-exposed substrate is removed from the substrate stage.

In summary, the present invention provides an exposure apparatus and a method for defocus and tilt error compensation, in which each of alignment sensors corresponds to and has the same coordinate in the first direction as a respective one of focusing sensors, so that each of the alignment sensors is arranged on the same straight line as a respective one of the focusing sensors. As such, the alignment marks can be characterized with both focusing information and alignment information. This enables the correction of error(s) in the alignment information and thus achieves defocus and tilt error compensation, resulting in significant improvements in alignment accuracy and the production yield.

The foregoing description presents merely a few preferred embodiments of the present invention and does not limit the scope thereof in any sense. All variations and modifications made by any person of ordinary skill in the art based on the above disclosure fall within the scope as defined by the appended claims.

The invention claimed is:

1. An exposure apparatus, comprising:
   a plurality of first sensors arranged in a first direction and configured to detect a plurality of alignment marks on a substrate to obtain alignment information of the substrate;
   a plurality of second sensors configured to detect focusing information of the substrate, wherein each of the plurality of first sensors corresponds to a respective one of the plurality of second sensors, and wherein each of the plurality of first sensors has a same first-direction coordinate as the respective one of the plurality of second sensors; and
   a plurality of projection objective lenses, wherein each of the plurality of projection objective lenses corresponds to a respective one of the plurality of first sensors and a respective one of the plurality of second sensors, and wherein each of the plurality of projection objective lenses has a same first-direction coordinate as each of the respective one of the plurality of first sensors and the respective one of the plurality of second sensors,
   wherein the plurality of second sensors are evenly distributed on both sides of the plurality of first sensors, or the plurality of second sensors are located on one side of the plurality of first sensors.

2. The exposure apparatus of claim 1, further comprising a mask stage for carrying a mask and a substrate stage for carrying the substrate, wherein the plurality of projection objective lenses are configured to expose the substrate and thereby form an image of the mask on the substrate during movement of the mask on the mask stage in synchronization with the substrate on the substrate stage in a second direction, and wherein the second direction is perpendicular to the first direction.

3. The exposure apparatus of claim 1, wherein the plurality of projection objective lenses are evenly distributed on both sides of the plurality of second sensors and the plurality of first sensors, or the plurality of projection objective lenses are located on one side of the plurality of second sensors and the plurality of first sensors.

4. The exposure apparatus of claim 1, wherein a number of the plurality of second sensors and a number of the plurality of first sensors are same and are three or more.

5. The exposure apparatus of claim 4, wherein the substrate is divided into a plurality of scanning exposure fields each comprising two columns of alignment marks along a second direction with each column of alignment marks arranged along the first direction, wherein the second direction is perpendicular to the first direction, and wherein a number of alignment marks in each column is equal to the number of the plurality of first sensors so that one column of alignment marks are simultaneously detectable by the plurality of first sensors.

6. The exposure apparatus of claim 1, wherein each of the plurality of first sensors comprises a broadband light source, an illumination lens group, a beam splitting prism, a front imaging lens group, an alignment mark, a rear imaging lens group and an image sensor, wherein the broadband light source emanates a light beam that passes through the illumination lens group, the beam splitting prism and the front imaging lens group and illuminates the alignment mark, and after being reflected by the alignment mark, the light beam further propagates through the front imaging lens group, the beam splitting prism and the rear imaging lens group, thereby forming an image of the alignment mark on the image sensor, and wherein the image output from the image sensor is processed and used to obtain a position of the alignment mark that has been imaged.

7. The exposure apparatus of claim 1, wherein each of the plurality of second sensors comprises a broadband light source, an illumination lens group, a projection mark, a first reflector, a projection imaging lens group, a detection imaging lens group, a second reflector and an image sensor, wherein the broadband light source produces a light beam that passes through the illumination lens group, then illuminates the projection mark, is then reflected by the first reflector, then propagates through the projection imaging lens, then forms an image of the projection mark on the surface of the substrate and is thereby reflected by the substrate, then propagates through the detection imaging lens group, is then reflected by the second reflector, and then forms an image of the projection mark on the image sensor, and wherein the image output from the image sensor is processed and used to obtain focusing information of the substrate.

* * * * *